(«12») United States Patent
Yoshizaki

(10) Patent No.: US 10,348,253 B2
(45) Date of Patent: Jul. 9, 2019

(54) RADIO FREQUENCY MODULE AND COMMUNICATION DEVICE

(71) Applicant: Murata Manufacturing Co., Ltd., Kyoto (JP)

(72) Inventor: Yasunobu Yoshizaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/833,531

(22) Filed: Dec. 6, 2017

(65) Prior Publication Data

US 2018/0159482 A1 Jun. 7, 2018

(30) Foreign Application Priority Data

Dec. 6, 2016 (JP) .................... 2016-236330

(51) Int. Cl.
| | |
|---|---|
| *H03F 3/04* | (2006.01) |
| *H03F 1/30* | (2006.01) |
| *H03F 3/195* | (2006.01) |
| *H03F 3/213* | (2006.01) |
| *H03F 1/02* | (2006.01) |
| *H03F 3/24* | (2006.01) |

(52) U.S. Cl.
CPC ........... *H03F 1/302* (2013.01); *H03F 1/0205* (2013.01); *H03F 1/0261* (2013.01); *H03F 3/195* (2013.01); *H03F 3/213* (2013.01); *H03F 3/245* (2013.01); *H03F 2200/18* (2013.01); *H03F 2200/294* (2013.01); *H03F 2200/447* (2013.01); *H03F 2200/451* (2013.01); *H03F 2200/555* (2013.01)

(58) Field of Classification Search
CPC ........ H03F 1/14; H03F 3/04; H03F 2200/468; H03F 2200/528
USPC ........................................ 330/289; 327/513
See application file for complete search history.

(56) References Cited

U.S. PATENT DOCUMENTS

| | | | |
|---|---|---|---|
| 2008/0166980 A1 | 7/2008 | Fukamachi et al. | |
| 2014/0253243 A1 | 9/2014 | Hagisawa | |
| 2015/0222234 A1* | 8/2015 | Tabei | H03F 1/0266 |
| | | | 330/261 |
| 2018/0026582 A1* | 1/2018 | Sasaki | H03F 1/0261 |
| | | | 330/296 |

FOREIGN PATENT DOCUMENTS

| | | |
|---|---|---|
| JP | 2007-295327 A | 11/2007 |
| JP | 2009-088790 A | 4/2009 |
| JP | 2014-171170 A | 9/2014 |

* cited by examiner

*Primary Examiner* — Steven J Mottola
(74) *Attorney, Agent, or Firm* — Pearne & Gordon LLP

(57) ABSTRACT

A radio-frequency module includes a substrate, a low-noise amplifier circuit being a first amplifier circuit arranged in a first area in the substrate, a power amplifier circuit being a second amplifier circuit arranged in a second area in the substrate, and a duplexer being a component arranged between the first area and the second area in the substrate and having a heat generating property lower than that of the power amplifier circuit. The low-noise amplifier circuit includes a bias circuit configured to generate a bias current dependent on temperature characteristics of a first diode, a voltage generating circuit configured to generate a voltage dependent on temperature characteristics of a second diode as an operating voltage for the bias circuit, and an amplifier circuit configured to operate at an operating point determined by the bias current.

16 Claims, 3 Drawing Sheets ated patent document discloses a first
RADIO FREQUENCY MODULE AND COMMUNICATION DEVICE This application claims priority from Japanese Patent Application No. 2016-236330 filed on Dec. 6, 2016. The content of this application is incorporated herein by reference in its entirety.

BACKGROUND OF THE DISCLOSURE

1. Field of the Disclosure

The present disclosure relates to a radio frequency module and a communication device.

2. Description of the Related Art

Power amplifying modules for amplifying transmission signals of radio frequencies are used in various communication devices, such as wireless terminal devices (see, for example, Japanese Unexamined Patent Application Publication No. 2014-171170).

The above-mentioned patent document discloses a first power amplifying module. This module includes a constant voltage generating circuit for generating a constant voltage independent of a power supply voltage, a bias circuit for generating a bias current by using the constant voltage as an operating voltage, and an amplifying circuit for amplifying a transmission signal at an operating point determined by the bias current.

According to the first power amplifying module, even when a power supply voltage tends to fluctuate, for example, when the module is driven by a battery, because the bias current is not dependent on the power supply voltage, gain fluctuations in the amplifier circuit caused by the fluctuations of the power supply voltage are suppressed, and the linearity of amplification characteristics of the power amplifying module is improved.

The bias circuit described in the above-mentioned patent document includes a first diode and is configured to generate a bias current corresponding to a forward voltage of the first diode. Thus, although the bias current is not dependent on the power supply voltage, it has a first temperature dependence based on temperature characteristics of the forward voltage of the first diode.

The above-mentioned patent document discloses a second power amplifying module. In this module, a temperature characteristics compensating circuit is added to the constant voltage generating circuit. The temperature characteristics compensating circuit includes a second diode and is configured to provide the bias current with a second temperature dependence opposite to the first temperature dependence with respect to the constant voltage generated by the constant voltage generating circuit (i.e., operating voltage for the bias circuit).

According to the second power amplifying module, because the fluctuations of the bias current caused by temperature changes are reduced, the gain fluctuations in the amplifier circuit caused by the temperature changes are suppressed, and the linearity of amplification characteristics of the power amplifying module is improved.

Hereinafter, suppression of gain fluctuations in an amplifier circuit caused by temperature changes is referred to as temperature compensation.

The inventors consider a radio frequency module including a power amplifier circuit configured to amplify a transmission signal of a radio frequency and a low-noise amplifier circuit configured to amplify a reception signal of a radio frequency. For example, like the above-described radio frequency module, a module including a plurality of amplifier circuits can perform temperature compensation for each amplifier circuit by using the configuration in the related art.

However, when the module including the plurality of amplifier circuits simply applies the related art to each of the amplifier circuits, a temperature-characteristics compensation circuit is affected by the heat generated in the other amplifier circuits, and it is difficult to perform temperature compensation with high accuracy.

BRIEF SUMMARY OF THE DISCLOSURE

Accordingly, it is an object of the present disclosure to provide a radio frequency module including a plurality of amplifier circuits and capable of performing temperature compensation with high accuracy and a communication device using the radio frequency module.

According to preferred embodiments of the present disclosure, a radio frequency module includes a substrate, a first amplifier circuit arranged in a first area in the substrate, a second amplifier circuit arranged in a second area in the substrate, and a component arranged between the first area and the second area in the substrate and having a heat generating property lower than that of the second amplifier circuit. The first amplifier circuit includes a bias circuit including a first diode and configured to generate a bias current dependent on temperature characteristics of the first diode, a voltage generating circuit including a second diode having temperature characteristics approximately equivalent to the temperature characteristics of the first diode and configured to generate a voltage dependent on the temperature characteristics of the second diode as an operating voltage for the bias circuit, and an amplifier circuit configured to operate at an operating point determined by the bias current.

According to this configuration, substantially the same temperature compensation as in the related art can be performed in the first amplifier circuit. In addition, because the component having the heat generating property lower than that of the second amplifier circuit is arranged between the first and second areas, the influence of the heat from the second amplifier circuit on the first amplifier circuit is reduced, and the accuracy of the temperature compensation in the first amplifier circuit is improved.

Therefore, the gain fluctuations in the first amplifier circuit caused by temperature changes are suppressed, the linearity of the amplification characteristics of the first amplifier circuit is enhanced, and the noise figure of the first amplifier circuit is improved.

Because the component arranged between the first and second areas also reduces the influence of the heat from the first amplifier circuit on the second amplifier circuit, when temperature compensation is performed in the second amplifier circuit, the accuracy of the temperature compensation is also improved.

Therefore, the gain fluctuations in the second amplifier circuit caused by temperature changes are suppressed, the linearity of the amplification characteristics of the second amplifier circuit is enhanced, and the noise figure of the second amplifier circuit is also improved.

According to preferred embodiments of the present disclosure, the component may be at least one of a passive circuit component and a structure for heat dissipation.

According to this configuration, the component may be at least one of a passive circuit component, such as a duplexer, a matching circuit, or a heat dissipation via connected to a ground plane in the substrate, and a structure for heat dissipation, such as a heatsink. Thus the floor space of the substrate can be effectively used, and the influences of the heat exerted by the first amplifier circuit and the second amplifier circuit on each other can be reduced.

According to preferred embodiments of the present disclosure, the first amplifier circuit may be a low-noise amplifier circuit configured to amplify a reception signal, and the second amplifier circuit may be a power amplifier circuit configured to amplify a transmission signal.

The temperature compensation in the low-noise amplifier circuit may also be performed by a control IC separate from the low-noise amplifier circuit. However, if the control IC is distant from the low-noise amplifier circuit and the thermal coupling is insufficient, this may be a cause of impairing the accuracy of the temperature compensation. In contrast, according to the above-described configuration, because the first and second diodes are thermally coupled to each other within the same first area, the temperature compensation can be performed with high accuracy.

According to preferred embodiments of the present disclosure, the first amplifier circuit may be an integrated circuit device in which the voltage generating circuit, the bias circuit, and the amplifier circuit are integrated.

According to this configuration, because the first and second diodes are thermally coupled to each other within the same integrated circuit device, the temperature compensation can be performed with higher accuracy. When the first amplifier circuit is a low-noise amplifier circuit, the low-noise amplifier circuit with the temperature compensation function that has not heretofore been achieved as an integrated circuit device is provided as a new integrated circuit device.

According to preferred embodiments of the present disclosure, the first diode and the second diode may be arranged in positions where their thermal distances from the second amplifier circuit are approximately equivalent to each other.

According to this configuration, the influence of the heat from the second amplifier circuit on the first diode and the influence of the heat from the second amplifier circuit on the second diode are similar to each other. Thus the temperature difference between the first and second diodes is reduced, and the accuracy of the temperature compensation is improved.

According to preferred embodiments of the present disclosure, a communication device includes the above-described radio frequency module and an RF signal processing circuit configured to transmit a radio-frequency transmission signal to the radio frequency module and configured to receive a radio-frequency reception signal from the radio frequency module.

According to this configuration, the communication device having the advantage of the above-described radio frequency module is obtainable.

According to the radio frequency module and the communication device according to preferred embodiments of the present disclosure, the radio frequency module including the plurality of amplifier circuits and capable of performing temperature compensation with high accuracy and the communication device using this radio frequency module are obtainable.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
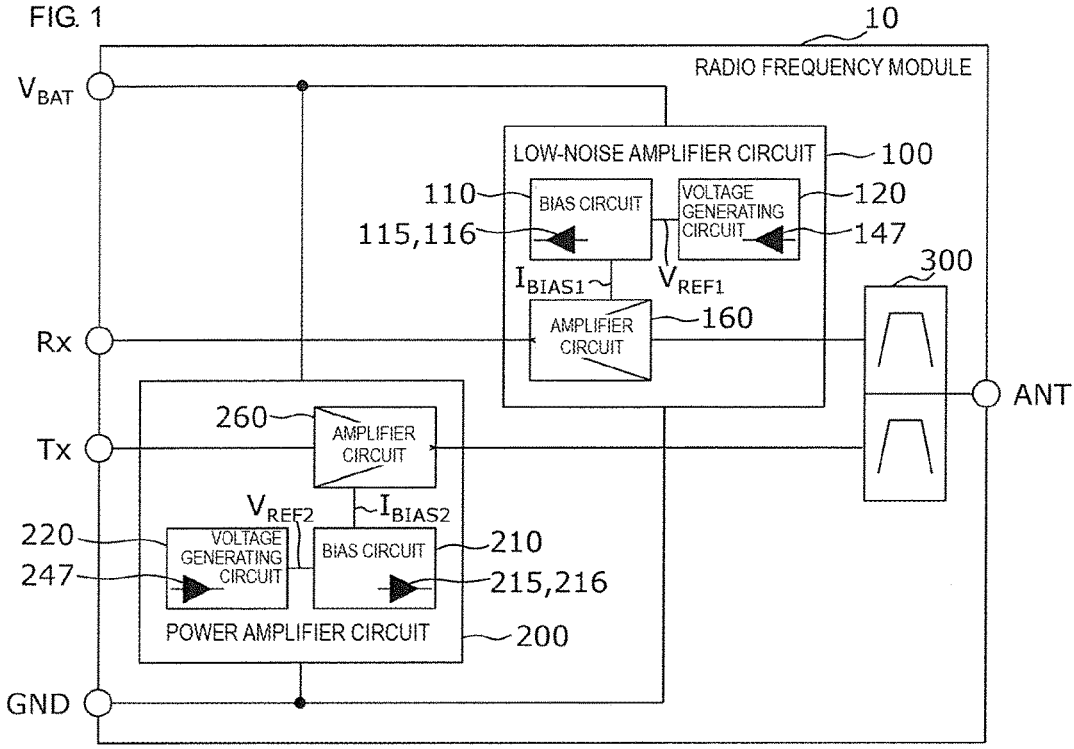
FIG. 1 is a block diagram that illustrates an example of a functional configuration of a radio frequency module according to a first embodiment.

Embodiments of the present disclosure are described below with reference to the drawings. The embodiments described below indicate comprehensive or specific examples. The numerical values, shapes, materials, constituent elements, and arrangements and connection forms of the constituent elements in the embodiments below are examples and are not intended to restrict the present disclosure. Among the constituent elements in the embodiments below, constituent elements that are not described in independent claims are described as optional constituent elements. The sizes of the constituent elements or the ratios between the sizes illustrated in the drawings are not necessarily precise.

First Embodiment

An example radio frequency module according to a first embodiment may be a composite component for use on a front end of a communication device and include a low-noise amplifier circuit configured to amplify a reception signal of a radio frequency and a power amplifier circuit configured to amplify a transmission signal of a radio frequency, both of the circuits being implemented on a single substrate.

FIG. 1 is a block diagram that illustrates an example of a functional configuration of the radio frequency module according to the first embodiment. As illustrated in FIG. 1, a radio frequency module 10 includes a low-noise amplifier circuit 100, a power amplifier circuit 200, and a duplexer 300.

The low-noise amplifier circuit 100 is an amplifier circuit with the temperature compensation function and is configured to amplify a reception signal received from the duplexer 300 and transmit it to an Rx terminal. The low-noise amplifier circuit 100 includes a bias circuit 110, a voltage generating circuit 120, and an amplifier circuit 160.

The bias circuit 110 includes diodes 115 and 116 and is configured to generate a bias current $I_{BIAS1}$ dependent on the temperature characteristics of the diodes 115 and 116. The diodes 115 and 116 are the examples of a first diode.

The voltage generating circuit 120 includes a diode 147 having temperature characteristics approximately equivalent to those of the diodes 115 and 116 and is configured to generate a voltage $V_{REF1}$ dependent on the temperature characteristics of the diode 147 as an operating voltage for the bias circuit 110. The temperature dependence of the voltage $V_{REF1}$ is set such that the bias current $I_{BIAS1}$ has temperature dependence opposite to the temperature dependence based on the diodes 115 and 116. The diode 147 is an example of a second diode.

Here, the diode 147 having the temperature characteristics approximately equivalent to those of the diodes 115 and 116 indicates the diodes 147, 115, and 116 having the same temperature characteristics in terms of specifications of the elements. The same temperature characteristics may include simply matching of temperature coefficients of their forward voltages on the positive or negative side.

The amplifier circuit 160 is configured to operate at an operating point determined by the bias current $I_{BIAS1}$ and amplify a reception signal.

Specific circuit examples of the bias circuit 110, voltage generating circuit 120, and amplifier circuit 160 are described below.

The power amplifier circuit 200 is an amplifier circuit with the temperature compensation function and is configured to amplify a transmission signal received at a Tx terminal and transmit it to the duplexer 300. The power amplifier circuit 200 includes a bias circuit 210, a voltage generating circuit 220, and an amplifier circuit 260.

The bias circuit 210 includes diodes 215 and 216 and is configured to generate a bias current $I_{BIAS2}$ dependent on the temperature characteristics of the diodes 215 and 216.

The voltage generating circuit 220 includes a diode 247 having temperature characteristics approximately equivalent to those of the diodes 215 and 216 and is configured to generate a voltage $V_{REF2}$ dependent on the temperature characteristics of the diode 247 as an operating voltage for the bias circuit 210. The temperature dependence of the voltage $V_{REF2}$ is set such that the bias current $I_{BIAS2}$ has temperature dependence opposite to the temperature dependence based on the diodes 215 and 216. The definition of having approximately equivalent temperature characteristics is the same as that described above.

The amplifier circuit 260 is configured to operate at an operating point determined by the bias current $I_{BIAS2}$ and amplify a transmission signal.

The duplexer 300 is configured to combine or separate transmission signals and reception signals. One example of the duplexer 300 may be a combination of passive circuit components, such as a filter, a hybrid circuit, and a circulator. The heat generating property of the duplexer 300 is lower than that of the power amplifier circuit 200.

Antenna signals in which transmission signals and reception signals are combined are transmitted or received at an ANT terminal.

The low-noise amplifier circuit 100 and power amplifier circuit 200 operate on a battery voltage supplied between a $V_{BAT}$ terminal and a GND terminal.

In this configuration, the low-noise amplifier circuit 100 is an example of a first amplifier circuit, and the power amplifier circuit 200 is an example of a second amplifier circuit.

Next, an arrangement of members included in the radio frequency module 10 is described.

Figure 2:
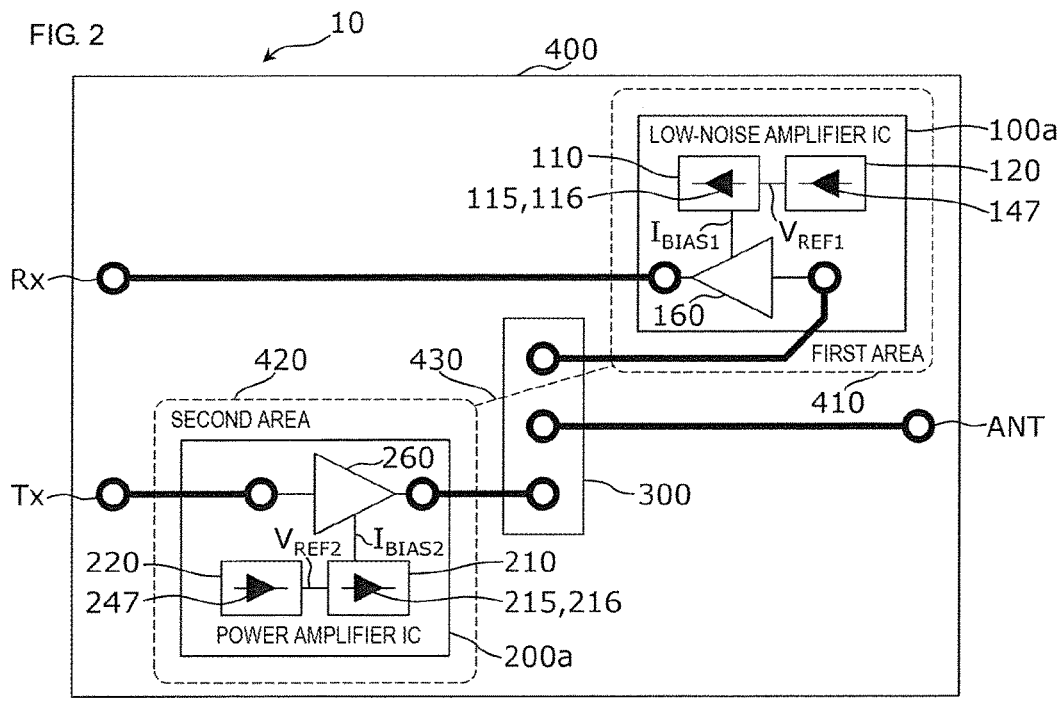
FIG. 2 is a schematic diagram that illustrates an example of an arrangement of members included in the radio frequency module according to the first embodiment.

FIG. 2 is a schematic diagram that illustrates an example of an arrangement of members included in the radio frequency module 10. The arrangement illustrated in FIG. 2 is an example of the arrangement of the members when a substrate 400 included in the radio frequency module 10 is seen in a plan view.

A low-noise amplifier integrated circuit (IC) 100a in which the low-noise amplifier circuit 100 is incorporated, a power amplifier IC 200a in which the power amplifier circuit 200 is incorporated, and the duplexer 300 are arranged on the substrate 400. The low-noise amplifier IC 100a, power amplifier IC 200a, and duplexer 300 are electrically connected to each other with lands and wiring patterns disposed on the substrate 400. In FIG. 2, the lands and wiring patterns are indicated by thick circles and thick lines, respectively.

The low-noise amplifier IC 100a and power amplifier IC 200a are arranged in a first area 410 and a second area 420 in the substrate 400, respectively, and the duplexer 300 is arranged between the first area 410 and second area 420. Here, one example of a position arranged between the first area 410 and second area 420 may be a position that overlaps with the shortest straight line 430 connecting the first area 410 and second area 420.

The low-noise amplifier circuit 100 and power amplifier circuit 200 are not limited to the low-noise amplifier IC 100a and power amplifier IC 200a, respectively, and may be a circuit disposed in the first area 410 and that in the second area 420, respectively, each of the circuits being formed using a discrete component.

The component arranged between the first area 410 and second area 420 in the substrate 400 is not limited to the duplexer 300 and may be any component that has a heat generating property lower than that of the power amplifier circuit 200. An example of such a component, not illustrated, may be at least one of a passive circuit component, such as an inductor or a capacitor constituting a matching circuit or a heat dissipation via connected to a ground plane, and a structure for heat dissipation, such as a heatsink. A plurality of components each having a heat generating property lower than that of the power amplifier circuit 200 may be arranged between the first area 410 and second area 420 in the substrate 400.

The diodes 115 and 116 and the diode 147 may be arranged in positions where their thermal distances from the power amplifier IC 200a (power amplifier circuit 200) are approximately equivalent to each other. The positions where their thermal distances from the power amplifier circuit 200 are approximately equivalent to each other may be defined as, for example, positions where approximately uniform temperature rises are caused by heat generation in the power amplifier circuit 200. The approximately uniform temperature rises indicate that in temperature rises, the temperature difference between the diodes 115 and 116 and the diode 147 is suppressed at or below a threshold (on the order of approximately 3° C. in one example) determined in accordance with the accuracy required for temperature compensation.

Next, the function of compensating for temperature characteristics of the low-noise amplifier circuit 100 is described. In the present specification, the low-noise amplifier circuit 100 has the same function of compensating for temperature characteristics as that described in the above-mentioned patent document, and reference is made to the example circuit described in the above-mentioned patent document as a specific example of the bias circuit 110, voltage generating circuit 120, and amplifier circuit 160. In the description below, the voltage $V_{REF1}$ illustrated in FIGS. 1 and 2 is made up of two voltages $V_{REFB1}$ and $V_{REFC1}$.

Figure 3:
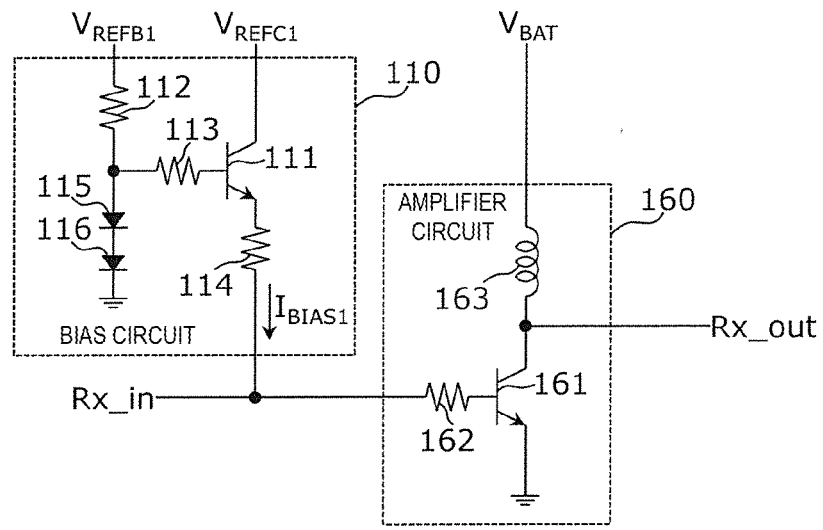
FIG. 3 is a circuit diagram that illustrates an example of a bias circuit and an amplifier circuit according to the first embodiment.

FIG. 3 is a circuit diagram that illustrates an example of the bias circuit 110 and amplifier circuit 160.

As illustrated in FIG. 3, the bias circuit 110 includes a transistor 111, resistors 112 to 114, and diodes 115 and 116. The bias circuit 110 operates on the voltages $V_{REFB1}$ and $V_{REFC1}$ supplied from the voltage generating circuit 120. The transistor 111 is configured to generate the bias current $I_{BIAS1}$ dependent on the forward voltage of the diodes 115 and 116 and the voltages $V_{REFB1}$ and $V_{REFC1}$ and to supply it to the amplifier circuit 160.

The amplifier circuit 160 includes a transistor 161, a resistor 162, and an inductor 163. The transistor 161 is configured to amplify a reception signal Rx_in supplied from the duplexer 300 at an operating point determined by the bias current $I_{BIAS1}$ and to output a reception signal Rx_out obtained by the amplification.

Figure 4:
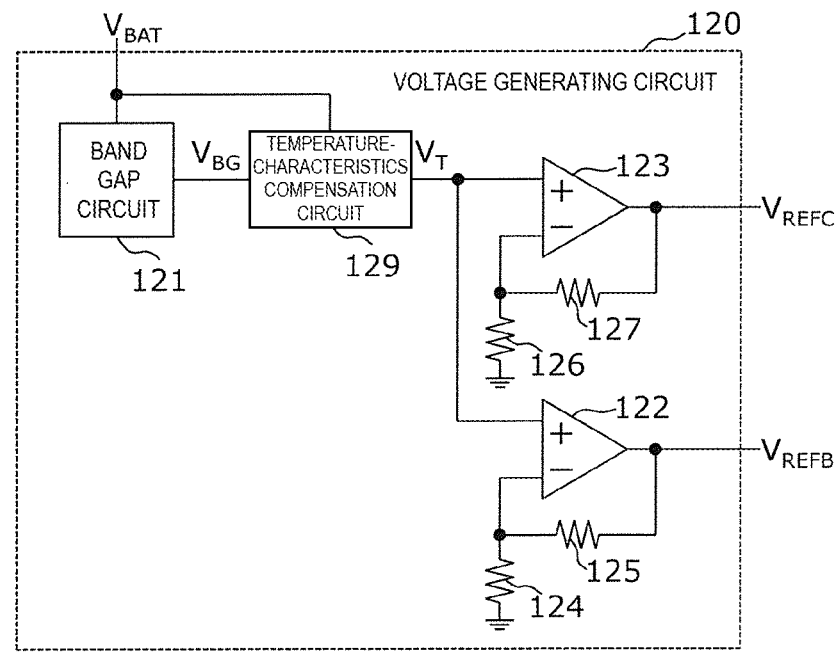
FIG. 4 is a circuit diagram that illustrates an example of a voltage generating circuit according to the first embodiment.

FIG. 4 is a circuit diagram that illustrates an example of the voltage generating circuit 120.

As illustrated in FIG. 4, the voltage generating circuit 120 includes a band gap circuit 121, operational amplifiers 122 and 123, resistors 124 to 127, and a temperature-characteristics compensation circuit 129.

The voltage generating circuit 120 operates on a battery voltage $V_{BAT}$. The band gap circuit 121 is configured to generate a band gap reference voltage $V_{BG}$ independent of the temperature and battery voltage $V_{BAT}$. The temperature-characteristics compensation circuit 129 is configured to generate a voltage $V_T$ having temperature dependence from the band gap reference voltage $V_{BG}$.

The operational amplifier 122 and resistors 124 and 125 constitute a noninverting amplifier circuit and are configured to generate a voltage $V_{REFB}$ in which the voltage $V_T$ is multiplied by a factor corresponding to the resistance values of the resistors 124 and 125. Similarly, the operational amplifier 123 and resistors 126 and 127 constitute a noninverting amplifier circuit and are configured to generate a voltage $V_{REFC}$ in which the voltage $V_T$ is multiplied by a factor corresponding to the resistance values of the resistors 126 and 127. The voltages $V_{REFB}$ and $V_{REFC}$ reflect the temperature dependence of the voltage $V_T$.

Figure 5:
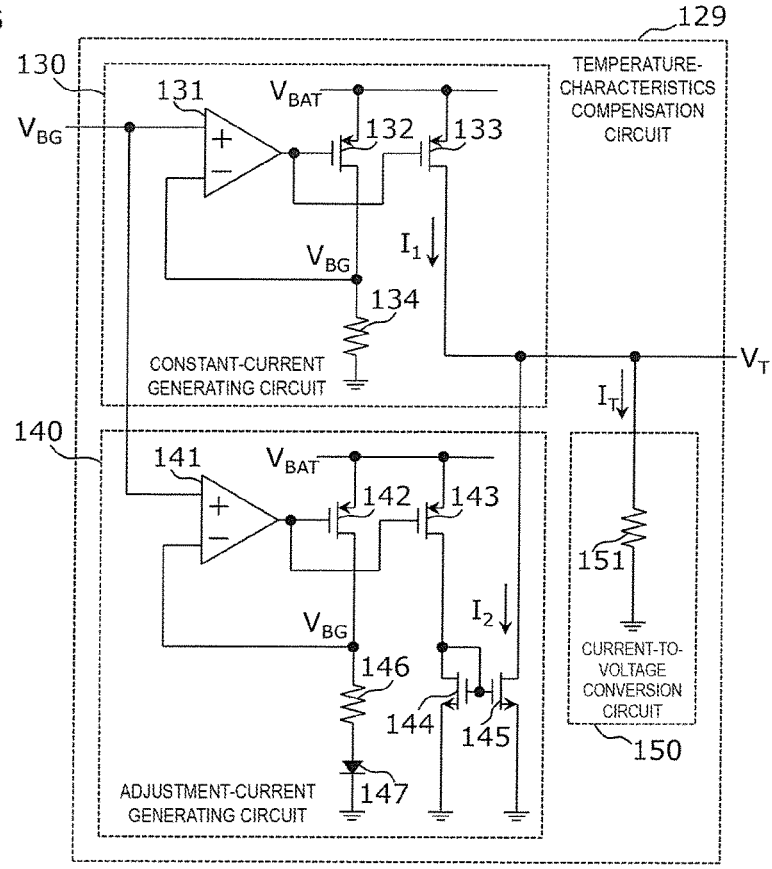
FIG. 5 is a circuit diagram that illustrates an example of a temperature-characteristics compensation circuit according to the first embodiment.

FIG. 5 is a circuit diagram that illustrates an example of the temperature-characteristics compensation circuit 129. As illustrated in FIG. 5, the temperature-characteristics compensation circuit 129 includes a constant-voltage generating circuit 130, an adjustment-current generating circuit 140, and a current-to-voltage conversion circuit 150. The constant-voltage generating circuit 130 includes an operational amplifier 131, transistors 132 and 133, and a resistor 134. The adjustment-current generating circuit 140 includes an operational amplifier 141, transistors 142 to 145, a resistor 146, and the diode 147. The current-to-voltage conversion circuit 150 includes a resistor 151.

The constant-voltage generating circuit 130 is configured to generate a constant current $I_1$ independent of temperature. The adjustment-current generating circuit 140 is configured to generate an adjustment current $I_2$ having temperature dependence corresponding to the temperature characteristics of the diode 147. The current-to-voltage conversion circuit 150 is configured to convert a current $I_T$ that varies in accordance with the constant current $I_1$ generated by the constant-voltage generating circuit 130 and the adjustment current $I_2$ generated by the adjustment-current generating circuit 140 into the voltage $V_T$. The temperature dependence corresponding to the temperature characteristics of the diode 147 is provided to the voltage $V_T$ through the adjustment current $I_2$.

According to the bias circuit 110 illustrated in FIG. 3, at low temperatures where the forward voltage of the diodes 115 and 116 rises, the bias current $I_{BIAS1}$ is reduced by a decrease in the base current of the transistor 111.

In contrast, according to the temperature-characteristics compensation circuit illustrated in FIG. 5, at low temperatures where the forward voltage of the diode 147 rises, the adjustment current $I_2$ decreases and the current $I_T$ increases, and thus the voltage $V_T$ is raised. When the voltage $V_T$ is raised, the voltages $V_{REFB}$ and $V_{REFC}$ rise and the bias current $I_{BIAS1}$ increase.

That is, the diode 147 provides the bias current $I_{BIAS1}$ with second temperature dependence opposite to the first temperature dependence based on the diodes 115 and 116. Accordingly, when the same temperature change occurs in the diodes 115, 116, and 147, the first temperature dependence and second temperature dependence of the bias current $I_{BIAS1}$ cancel each other out, and the temperature compensation is performed in the low-noise amplifier circuit 100.

The bias circuit 210, voltage generating circuit 220, and amplifier circuit 260 in the power amplifier circuit 200 are the same as the bias circuit 110, voltage generating circuit 120, and amplifier circuit 160 in the low-noise amplifier circuit 100, respectively. That is, the power amplifier circuit 200 also has the function of compensating for the temperature characteristics achieved by substantially the same configuration as in the low-noise amplifier circuit 100. The power amplifier circuit 200 can be described by reading the reference numerals in the description of the low-noise amplifier circuit 100 with reference to FIGS. 3 to 5 as the corresponding ones in the power amplifier circuit 200, and it is not described here.

According to the radio frequency module 10 configured as described above, substantially the same temperature compensation as that in the related art can be performed in the low-noise amplifier circuit 100. In addition, because the duplexer 300, which is a component having a heat generating property lower than that of the power amplifier circuit 200, is arranged between the first area 410 and second area 420, the influence of the heat from the power amplifier circuit 200 on the low-noise amplifier circuit 100 can be reduced, and the accuracy of the temperature compensation in the low-noise amplifier circuit 100 can be improved.

Therefore, the gain fluctuations in the low-noise amplifier circuit 100 caused by temperature changes are suppressed, the linearity of the amplification characteristics of the low-noise amplifier circuit 100 is enhanced, and the noise figure of the low-noise amplifier circuit 100 is improved.

The duplexer 300, which is arranged between the first area 410 and second area 420, also reduces the influence of the heat from the low-noise amplifier circuit 100 on the power amplifier circuit 200. Thus the accuracy of the temperature compensation in the power amplifier circuit 200 is also improved.

Therefore, because the gain fluctuations in the power amplifier circuit 200 caused by the temperature changes are suppressed, the linearity of the amplification characteristics of the power amplifier circuit 200 is enhanced, and the noise figure of the power amplifier circuit 200 is improved.

The arrangement of the component having the heat generating property lower than that of the power amplifier circuit 200 between the first area 410 and second area 420 can enable effective use of the floor space of the substrate 400 and can also reduce the influences of heat exerted by the low-noise amplifier circuit 100 and power amplifier circuit 200 on each other.

The temperature compensation in the low-noise amplifier circuit 100 may also be performed by a control IC separate from the low-noise amplifier circuit 100. However, if the control IC is distant from the low-noise amplifier circuit 100 and the thermal coupling is insufficient, this may be a cause of impairing the accuracy of the temperature compensation. In contrast, according to the radio frequency module 10, because the diodes 115 and 116 and the diode 147 are thermally coupled to each other within the same first area 410, the temperature compensation can be performed with high accuracy.

When the low-noise amplifier circuit 100 is configured in the low-noise amplifier IC 100a, because the diodes 115 and 116 and the diode 147 are thermally coupled to each other inside the same integrated circuit device, the temperature compensation can be performed with higher accuracy. The low-noise amplifier circuit with the temperature compensation function that has not heretofore been achieved as an integrated circuit device is provided as a new integrated circuit device.

The diodes 115 and 116 and the diode 147 may be arranged in positions where their thermal distances from the power amplifier circuit 200 are approximately equivalent to each other. In this case, the influence of the heat from the power amplifier circuit 200 on the diodes 115 and 116 and that on the diode 147 are reduced and equalized, and the accuracy of the temperature compensation can be further improved.

Second Embodiment

A communication device including the radio frequency module according to the first embodiment is described in a second embodiment.

Figure 6:
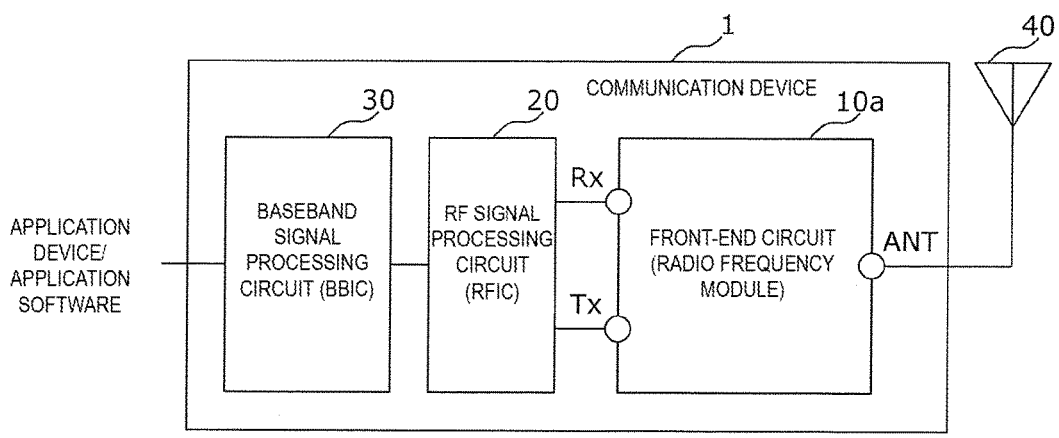
FIG. 6 is a block diagram that illustrates an example of a functional configuration of a communication device according to a second embodiment.

FIG. 6 is a block diagram that illustrates an example of a functional configuration of a communication device 1 according to the second embodiment. As illustrated in FIG. 6, the communication device 1 includes a front-end circuit 10a, an RF signal processing circuit 20, and a baseband signal processing circuit 30.

The front-end circuit 10a is configured to amplify a transmission RF signal generated by the RF signal processing circuit 20 by using a power amplifier and to supply it to an antenna 40. The front-end circuit 10a is also configured to amplify a reception RF signal received at the antenna 40 by using a low-noise amplifier and to supply it to the RF signal processing circuit 20. The front-end circuit 10a includes the radio frequency module 10 according to the first embodiment.

The RF signal processing circuit 20 is configured to convert a transmission signal generated by the baseband signal processing circuit 30 into a transmission RF signal and to supply it to the front-end circuit 10a. This conversion may include modulation and up-conversion of signals. The RF signal processing circuit 20 is also configured to convert a reception RF signal received from the front-end circuit 10a into a reception signal and to supply it to the baseband signal processing circuit 30. This conversion may include demodulation and down-conversion of signals. The RF signal processing circuit 20 may be configured in a radio-frequency integrated circuit (RFIC) chip.

The baseband signal processing circuit 30 is configured to convert transmission data created by an application device or application software into a transmission signal and to supply it to the RF signal processing circuit 20. This conversion may include data compression, multiplexing, and addition of error correcting code. The baseband signal processing circuit 30 is also configured to convert a reception signal received from the RF signal processing circuit 20 into reception data and to supply it to the application device or application software. This conversion may include data extraction, demultiplexing, and error correction. The baseband signal processing circuit 30 may be configured in a baseband integrated circuit (BBIC) chip.

The application device or application software is configured to carry out application operations, such as audio communications and image displaying, by using transmission data and reception data.

According to the communication device 1, the use of the radio frequency module 10 according to the first embodiment in the front-end circuit 10a can enable accurate temperature compensation performed in both the low-noise amplifier circuit and power amplifier circuit.

The radio frequency module and communication device according to the embodiments of the present disclosure have been described above. The present disclosure is not limited to the individual embodiments. Forms in which various modifications conceivable by those skilled in the art are made to the embodiments and forms in which constituent elements in different embodiments are combined may also be included in the scope of one or more modes of the present disclosure without departing from the principles and spirit of the present disclosure.

The present disclosure can be widely used as a radio frequency module in various communication devices.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency module comprising:
   a substrate;
   a first amplifier circuit arranged in a first area in the substrate;
   a second amplifier circuit arranged in a second area in the substrate; and
   a component arranged between the first area and the second area in the substrate and having a heat generating property lower than a heat generating property of the second amplifier circuit,
   wherein the first amplifier circuit includes
      a bias circuit including a first diode and configured to generate a bias current dependent on temperature characteristics of the first diode,
      a voltage generating circuit including a second diode having temperature characteristics approximately equivalent to the temperature characteristics of the first diode and configured to generate a voltage dependent on the temperature characteristics of the second diode as an operating voltage for the bias circuit, and
      an amplifier circuit configured to operate at an operating point determined by the bias current.

2. The radio frequency module according to claim 1, wherein the component is at least one of a passive circuit component and a structure for heat dissipation.

3. The radio frequency module according to claim 1, wherein the first amplifier circuit is a low-noise amplifier circuit configured to amplify a reception signal, and
   the second amplifier circuit is a power amplifier circuit configured to amplify a transmission signal.

4. The radio frequency module according to claim 1, wherein the first amplifier circuit is an integrated circuit device having the voltage generating circuit, the bias circuit and the amplifier circuit integrated.

5. The radio frequency module according to claim 1, wherein the first diode and the second diode are arranged in positions where thermal distances of the first diode and the second diode from the second amplifier circuit are approximately equivalent to each other.

6. A communication device comprising:
the radio frequency module according to claim 1; and
an RF signal processing circuit configured to transmit a radio-frequency transmission signal to the radio frequency module and configured to receive a radio-frequency reception signal from the radio frequency module.

7. The radio frequency module according to claim 2, wherein the first amplifier circuit is a low-noise amplifier circuit configured to amplify a reception signal, and
the second amplifier circuit is a power amplifier circuit configured to amplify a transmission signal.

8. The radio frequency module according to claim 2, wherein the first amplifier circuit is an integrated circuit device having the voltage generating circuit, the bias circuit and the amplifier circuit integrated.

9. The radio frequency module according to claim 3, wherein the first amplifier circuit is an integrated circuit device having the voltage generating circuit, the bias circuit and the amplifier circuit integrated.

10. The radio frequency module according to claim 2, wherein the first diode and the second diode are arranged in positions where thermal distances of the first diode and the second diode from the second amplifier circuit are approximately equivalent to each other.

11. The radio frequency module according to claim 3, wherein the first diode and the second diode are arranged in positions where thermal distances of the first diode and the second diode from the second amplifier circuit are approximately equivalent to each other.

12. The radio frequency module according to claim 4, wherein the first diode and the second diode are arranged in positions where thermal distances of the first diode and the second diode from the second amplifier circuit are approximately equivalent to each other.

13. A communication device comprising:
the radio frequency module according to claim 2; and
an RF signal processing circuit configured to transmit a radio-frequency transmission signal to the radio frequency module and configured to receive a radio-frequency reception signal from the radio frequency module.

14. A communication device comprising:
the radio frequency module according to claim 3; and
an RF signal processing circuit configured to transmit a radio-frequency transmission signal to the radio frequency module and configured to receive a radio-frequency reception signal from the radio frequency module.

15. A communication device comprising:
the radio frequency module according to claim 4; and
an RF signal processing circuit configured to transmit a radio-frequency transmission signal to the radio frequency module and configured to receive a radio-frequency reception signal from the radio frequency module.

16. A communication device comprising:
the radio frequency module according to claim 5; and
an RF signal processing circuit configured to transmit a radio-frequency transmission signal to the radio frequency module and configured to receive a radio-frequency reception signal from the radio frequency module.

* * * * *